United States Patent [19]

Sproul

[11] Patent Number: 4,608,243

[45] Date of Patent: Aug. 26, 1986

[54] HIGH HARDNESS HAFNIUM NITRIDE

[75] Inventor: William D. Sproul, Palatine, Ill.

[73] Assignee: Borg-Warner Corporation, Chicago, Ill.

[21] Appl. No.: 788,313

[22] Filed: Oct. 17, 1985

Related U.S. Application Data

[63] Continuation of Ser. No. 481,952, Apr. 4, 1983, abandoned.

[51] Int. Cl.[4] .................. C01B 31/34; C23C 15/00
[52] U.S. Cl. .............................. 423/409; 204/192 C
[58] Field of Search .................. 423/409; 204/192 C

[56] References Cited

U.S. PATENT DOCUMENTS

| Re. 29,989 | 5/1979 | Polk et al. | 428/661 |
| Re. 30,106 | 10/1979 | Polk et al. | 204/23 |
| 430,094 | 11/1881 | Habesch, Jr. et al. | 75/0.5 R |
| 3,429,661 | 2/1969 | Neuenschwander et al. | 423/409 |
| 3,450,499 | 6/1969 | Yates | 423/409 |
| 3,647,662 | 3/1972 | Gerstenberg et al. | 204/192 C |
| 3,774,703 | 11/1973 | Sanderson | 117/75 |
| 3,977,061 | 8/1976 | Lindstrom et al. | 29/95 R |
| 4,006,073 | 2/1977 | Welch | 204/298 |
| 4,052,738 | 10/1977 | Hosomi et al. | 358/128 |
| 4,054,426 | 10/1977 | White | 51/309 R |
| 4,056,457 | 11/1977 | Vossen, Jr. | 204/192 SP |
| 4,080,431 | 3/1978 | Moss | 423/409 |
| 4,209,375 | 6/1980 | Gates et al. | 204/192 R |

FOREIGN PATENT DOCUMENTS 90406 7/1980 Japan ......................... 423/409

OTHER PUBLICATIONS

Aron et al, "Some Properties of R.F. Sputtered Hafnium Nitride Coatings," *Thin Solid Films*, 96 (1982) pp. 87–91.

Primary Examiner—John Doll
Assistant Examiner—Wayne A. Langel
Attorney, Agent, or Firm—James A. Geppert

[57] ABSTRACT

A high hardness hafnium nitride formed by a reactive sputter coating of a substrate in a closed chamber with a substantially pure hafnium target, and an atmosphere of argon and nitrogen. The hafnium nitride has a face centered cubic structure with a lattice spacing of 4.55 to 4.58 Å, and a hardness in the range of 2700 to 5500 kilograms per square millimeter utilizing a Vickers microindentation hardness test.

8 Claims, 1 Drawing Figure

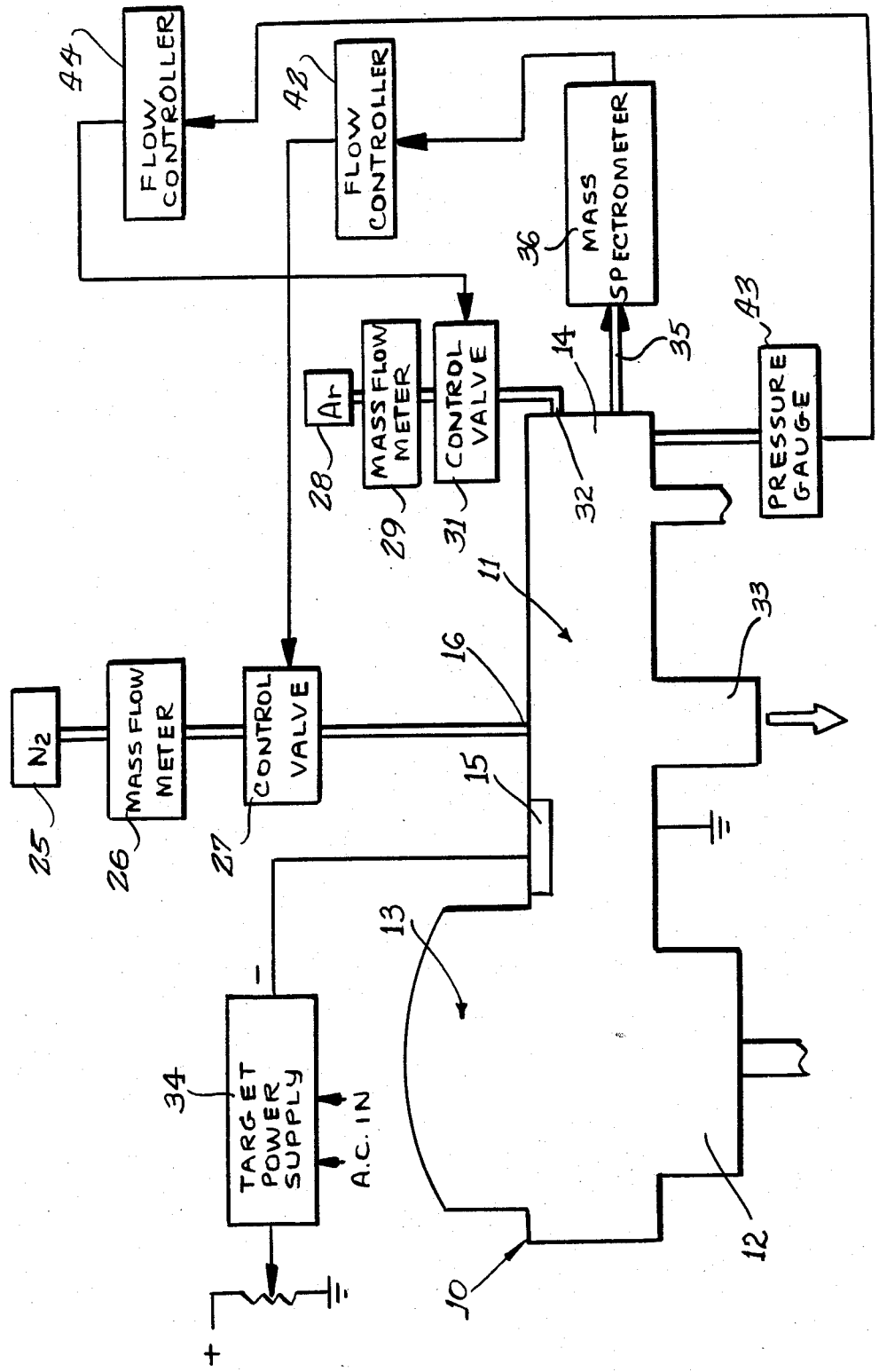

HIGH HARDNESS HAFNIUM NITRIDE

This is a continuation of application Ser. No. 481,952 filed Apr. 4, 1983, abandoned.

BACKGROUND OF THE INVENTION

The present invention relates to the rapid rate reactive sputtering of hafnium nitride onto a substrate or workpiece and to the resulting high hardness coating material. Methods for the coating of a metallic layer or a metallic compound onto a substrate include vapor deposition, plasma spray processes and cathode sputtering. Vapor deposition processes to provide a metallic thin film on a workpiece utilize the material for plating in a suitable atmosphere, such as a vacuum or an inert shielding gas, wherein the material is heated until it evaporates and is deposited as a film on a substrate.

Plasma spray processes provide the material to be deposited in the form of a fine-grained powder which is brought into a plasma arc so that the particles melt and are deposited on the substrate.

Cathodic magnetron sputtering or radio-frequency ionic sputtering involves a metallic target formed of the material to provide the desired coating on the substrate or workpiece in a gas discharge wherein the material is sputtered by ion bombardment; the metallic particles removed from the target being deposited on the substrate. The target becomes the cathode and the anode is located beneath the substrate. Where a thin film of metallic compounds, such as the oxides, nitrides, carbides or the like, are to be deposited on various substrates, reactive sputtering is utilized wherein the target consists of the metal for the plating compound and a neutral or inert gas, such as argon, is mixed with a reactive gas such as oxygen, nitrogen or methane. The particles dislodged from the target combine with the reactive gas to produce the desired compound which is deposited on the substrate or workpiece.

In the use of carbide or high speed steel tool bits for cutting or similar operations, wear becomes a substantial problem along with the ability to be resharpened or reground. To enhance the wear life of a cutting tool edge, the cutting surfaces are coated with a thin film of a wear resistant material, such as titanium carbide or titanium nitride. The present invention relates to an improved high hardness coating that will substantially increase the wear life of tools and other functional articles that require protection from wear.

SUMMARY OF THE INVENTION

The present invention comprehends the provision of an improved high hardness metallic compound that can be deposited on the surface of an article to substantially enhance the wear properties of the article.

The present invention also comprehends the provision of a high hardness coating of hafnium nitride on a substrate or workpiece. The hafnium nitride coating has an approximately 1.0% larger lattice spacing than that for bulk hafnium nitride with the hardness of the coating in the range of 65 to 69% greater than the hardness of the bulk material.

The present invention further comprehends the provision of a high hardness coating of hafnium nitride formed during a magnetron cathodic reactive sputtering process utilizing a hafnium target, an inert atmosphere of argon and a controlled quantity of nitrogen which reacts with the hafnium to deposit the high hardness coating on the substrate or workpiece.

DESCRIPTION OF THE DRAWING

The drawing FIGURE shows a schematic view of a magnetron sputtering apparatus utilized to produce the high hardness coating of the present invention and control therefor.

DESCRIPTION OF THE PREFERRED EMBODIMENT

Referring more particularly to the disclosure in the drawing wherein is shown an illustrative embodiment of reactive sputtering apparatus 10 for the plating of a thin film of hafnium nitride (HfN) of a suitable substrate. The apparatus includes an elongated chamber 11 having an elevator at one end 12 communicating with a domed loading/unloading chamber 13, a pallet which is carried by the elevator to receive the substrate to be coated, a pallet carrier receiving the pallet from the elevator and moving the pallet into the chamber 11 for sputtering in the central portion and/or etching on a platform at the end 14 of the chamber opposite to the elevator.

A magnetron cathode 15 in the chamber carries a target formed of hafnium metal and is located in the upper wall of the chamber 11. A substantially rectangular ring of tubing having a plurality of openings therein directed downwardly and inwardly for a purpose to be later described is positioned encompassing the periphery of the target. The tubing ring is connected to an inlet 16 in the upper wall for communication with a source 25 of nitrogen gas. The gas source is connected to the inlet through a mass flow meter 26 and a control valve 27.

A source 28 of argon gas communicates with an inlet 32 in the chamber end 14 through a second mass flow meter 29 and a control valve 31. Also, an outlet 33 in the floor of the chamber 11 is connected to a vacuum system for evacuation of the chamber to draw all air and other contaminants out prior to etching and sputtering. A horizontally moving shutter plate (not shown) having an opening or shutter therein may be utilized below the target to prevent any substantial scattering of material onto other portions of the chamber, thus directing the material onto the substrate below the opening.

Vacuum is continuously applied to the chamber 11 to draw all air and contaminants out through the outlet 33, and a substrate is loaded onto a carrier pallet in the domed chamber 13; which chamber is then sealed and evacuated. The elevator lowers the pallet onto a carrier which is shifted to the opposite end 14 of the chamber 11, and the elevator is raised to seal the domed chamber 13 from the main processing chamber 11. A throttle (not shown) is operated to close the outlet 33, and argon gas is admitted through the flow meter 29, control valve 31 and inlet 32 to backfill the chamber 11 with a partial pressure of argon. A pressure gauge 43 measures the pressure of the argon and provides a signal to a flow controller 44, which in turn signals the control valve 31 to maintain a constant pressure of 8 millitorr in the chamber.

A potential is applied to the substrate at the etching station, and the argon gas ionizes to provide argon ions which bombard the substrate to clean the surface to be coated. Once cleaned, the potential is interrupted and the substrate is shifted to a position beneath the hafnium target and cathode 15, and nitrogen gas is then admitted through the mass flow meter 26, control valve 27 and inlet 16 to be directed downward by the tubing ring to the substrate. A potential of a negative 450 to 500 volts is applied to the cathode 15 from a target power supply 34 and a bias voltage of minus 80 to 100 volts is applied to the substrate, whereupon the resulting argon ions bombard the hafnium target. The hafnium atoms displaced by the bombardment pass downward with the nitrogen gas to react and form hafnium nitride onto the cleaned surface of the substrate. Once the desired thickness of hafnium nitride has been achieved, the potential is interrupted and the substrate removed through the domed chamber 13.

A sampling tube 35 at the chamber end 14 provides a mass spectrometer 36 with a gas sample indicating the amount of excess (unreacted) nitrogen gas remaining in the chamber during sputtering. The nitrogen peak on the mass spectrometer screen is measured and a signal is generated to a flow controller 42 which in turn provides a signal to the nitrogen control valve 27 to control the partial pressure of the nitrogen in the chamber substantially continuously during the sputtering cycle. A more complete description of the sputtering operation and control circuits therefor is found in the application Case No. 082014-BWL filed concurrently herewith and reference is made thereto.

The sputtering reaction was carried out in a Materials Research Corporation (MRC) 902M In-Line sputtering system with both DC and RF magnetron, RF etch, and DC bias capabilities. Targets of hafnium and titanium and zirconium, for comparison, were MRC VP grade materials. Hafnium nitride was reactively sputtered from both a bonded planar hafnium target and from a Research S-Gun adapted to the MRC machine. Titanium nitride was reactively sputtered from both Inset and bonded planar titanium targets, and zirconium nitride from a zirconium Inset target. The target to substrate distance was three inches.

Argon was bled into the machine at a pressure in the range of 4.0 to 14.0 millitorr, although a preferred pressure is 8.0 millitorr. Nitrogen gas is admitted at an optimum flow rate based on the power applied to the target as shown in the following table.

TABLE I

| Target Power - kW | $N_2$ Flow, sccm* |
|---|---|
| 1.0 | 5.3 |
| 2.0 | 10.6 |
| 3.0 | 15.9 |
| 4.0 | 20.2 |
| 5.0 | 24.6 |

*standard cubic centimeters per minute.

The nitrogen and argon gas flows were controlled with MKS 260 flow controllers, and the chamber gas composition during sputtering was monitored with a UTi (Uthe Technology International) Model 100C mass spectrometer. The temperature of samples immediately emerging from the sputtering reaction never exceeded 315° C. (600° F.).

The hafnium nitride coating was deposited on several substrates with similar results. The substrates included Corning 7059 borosilicate glass slides, pieces of M-2 tool steel hardened to Rc65, and Valemite VC-2 carbide cutting tool inserts. Also, wear rings made from SAE 4620 carburized steel were coated with hafnium nitride; the coating thickness in all instances being in the range of 4.0 to 5.0 um. As examples of the deposition rates for hafnium nitride, to provide a coating thickness of approximately 3500 angstroms (A°), a scanning rate of the substrate under the shutter for the target was 10.0 inches per minute for a target power of 6.0 kilowatts (kw). For a stationary substrate, the deposition rate of hafnium nitride was 2950 A° per minute at 5.0 kw target power.

The sputter coated hafnium nitride was found to have a higher hardness compared with the bulk material. Utilizing a standard Vickers microindentation hardness test, the following table discloses the hardness of the hafnium nitride coating compared to other known group IVb metallic nitrides in bulk and sputter coated forms.

TABLE II

| Vickers Hardness (optical) | Bulk | Sputter Coated |
|---|---|---|
| TiN | 2000 kg/mm$^2$ | 2650 kg/mm$^2$ |
| ZrN | 1500 | 2350 |
| HfN | 1600 | 4200 |

It was found that there is a variation in hardness readings for optical versus scanning electron microscope (SEM) readings of the Vickers Hardness at 100 gms. and 200 gms. load for the three materials as shown in the following table.

TABLE III

| Material | Optical | SEM |
|---|---|---|
| TiN (100 gms.) | 3200 kg/mm$^2$ | 2350 kg/mm$^2$ |
| TiN (200 gms.) | 2650 | 2400 |
| ZrN (100 gms.) | 3350 | 2625 |
| ZrN (200 gms.) | 2350 | 2500 |
| HfN (100 gms.) | 5510 | 3110 |
| HfN (200 gms.) | 4200 | 2700 |

With respect to the hafnium nitride coating from the sputtering process, not only is the hardness 68% greater over the bulk material from values found in the literature, but the cell size has an increase in the lattice spacing for the face centered cubic structure of approximately 1% as follows:

TABLE IV

| Property | Bulk HfN | CVD HfN | Sputtered HfN |
|---|---|---|---|
| Cell size-A° | 4.52 | 4.51 | 4.55–4.58 |

Also, conventionally as the amount of nitrogen in bulk hafnium nitride increases, the cell size decreases. However, in the sputtered material, as nitrogen increases, the cell size also increases. Thus, the sputtered hafnium nitride provides a final coating of higher hardness and increased cell size compared to titanium nitride and zirconium nitride which, although having an increased hardness, do not have any change in the cell size of the sputter coated material over the bulk material. All three nitrides have face centered cubic structures. Obviously, the Vickers hardness values are an average of several readings at each of the testing loads for both the optical and scanning electron microscope readings.

I claim:

1. A high hardness hafnium nitride having a face centered cubic structure with a cell size of 4.55 to 4.58 A° and a hardness in the range of 2700 to 4200 kilograms per square millimeter for Vickers microindentation hardness.

2. A high hardness hafnium nitride as set forth in claim 1, wherein as the percentage of nitrogen in the nitride increases, the lattice spacing increases.

3. A high hardness hafnium nitride as set forth in claim 1, wherein the hafnium nitride is formed from a rapid rate sputtering operation of a nitride coating on a suitable substrate.

4. A high hardness hafnium nitrides as set forth in claim 3, wherein the coating is formed in an evacuated chamber containing argon in a pressure range of 4 to 14 millitorr and nitrogen is controlled at a feed rate of 12.1 to 31.5 standard cubic centimeters per minute.

5. A high hardness hafnium nitride as set forth in claim 4, in which the temperature during sputter coating is approximately 600° F.

6. A high hardness hafnium nitride as set forth in claim 4, in which the power to the hafnium target is in the range of 1.0 to 6.0 kilowatts and a bias of minus 80 to 100 volts is applied to the substrate.

7. A high hardness hafnium nitride as set forth in claim 4, in which the argon pressure is 8.0 millitorr.

8. A high hardness hafnium nitride as set forth in claim 3, in which said nitride coating is formed in a magnetron-type sputtering apparatus.

* * * * *